US006654467B1

(12) United States Patent
York et al.

(10) Patent No.: US 6,654,467 B1
(45) Date of Patent: Nov. 25, 2003

(54) ACTIVE NOISE CANCELLATION APPARATUS AND METHOD

(76) Inventors: Stanley J. York, 3967 Queen Anne Dr., Orlando, FL (US) 32839; Heung Ki Cho, 1255 Belle Ave., Suite 172, Winter Springs, FL (US) 32708

( * ) Notice: Subject to any disclaimer, the term of this patent is extended or adjusted under 35 U.S.C. 154(b) by 0 days.

(21) Appl. No.: 09/025,692

(22) Filed: Feb. 18, 1998

(30) Foreign Application Priority Data

May 7, 1997 (KR) ............................................ 0208507

(51) Int. Cl.[7] ............................................... H03B 29/00
(52) U.S. Cl. ................................... 381/71.14; 381/71.3
(58) Field of Search .......................... 381/71.14, 71.13, 381/71.8, 94.31, 94.7, 71.1, 71.3, 71.4, 94.1

(56) References Cited

U.S. PATENT DOCUMENTS

| | | | | | |
|---|---|---|---|---|---|
| 3,936,606 | A | * | 2/1976 | Wanke | |
| 4,435,751 | A | * | 3/1984 | Hori et al. | |
| 4,508,940 | A | * | 4/1985 | Steeger | 179/107 |
| 4,669,122 | A | * | 5/1987 | Swinbanks | |
| 4,953,217 | A | | 8/1990 | Twiney et al. | 381/72 |
| 5,010,576 | A | * | 4/1991 | Hill | |
| 5,111,507 | A | * | 5/1992 | Nakaji | 381/71.9 |
| 5,125,241 | A | | 6/1992 | Nakanishi et al. | 62/296 |
| 5,129,003 | A | | 7/1992 | Saruta | 381/71 |
| 5,140,640 | A | | 8/1992 | Graupe et al. | 381/71 |
| 5,267,320 | A | | 11/1993 | Fukumizo | 381/71 |
| 5,293,578 | A | * | 3/1994 | Nagami et al. | 381/71 |
| 5,365,594 | A | | 11/1994 | Ross et al. | 381/71 |
| 5,381,485 | A | | 1/1995 | Elliott | 381/71 |
| 5,448,645 | A | * | 9/1995 | Guerci | |
| 5,485,523 | A | | 1/1996 | Tamamura et al. | 381/71 |
| 5,488,667 | A | | 1/1996 | Tamamura et al. | 387/71 |
| 5,491,747 | A | | 2/1996 | Bartlett et al. | 379/433 |
| 5,493,616 | A | | 2/1996 | Iidaka et al. | 381/71 |
| 5,499,301 | A | | 3/1996 | Sudo et al. | 381/71 |
| 5,508,477 | A | | 4/1996 | Kato et al. | 181/205 |
| 5,539,831 | A | | 7/1996 | Harley | 381/67 |
| 5,546,467 | A | | 8/1996 | Denenberg | 381/71 |
| 5,559,893 | A | | 9/1996 | Krokstad et al. | 381/71 |
| 5,581,619 | A | | 12/1996 | Shibata et al. | 381/71 |
| 5,583,308 | A | * | 12/1996 | Owen | 84/619 |
| 5,600,729 | A | | 2/1997 | Darlington et al. | 381/71 |
| 5,602,927 | A | | 2/1997 | Tamamura et al. | 381/71 |
| 5,619,581 | A | | 4/1997 | Ferguson et al. | 381/71 |
| 5,649,018 | A | * | 7/1997 | Gifford et al. | 381/71.14 |
| 5,901,233 | A | * | 5/1999 | Hockney et al. | 381/94.3 |
| 5,995,632 | A | * | 11/1999 | Okada | 381/71.3 |

* cited by examiner

*Primary Examiner*—Forester W. Isen
*Assistant Examiner*—Brian Pendleton
(74) *Attorney, Agent, or Firm*—P. E. McQueeney, Esq.

(57) ABSTRACT

An active noise cancellation apparatus and method for actively reducing the level of noise generated by an ambient noise source, such as a domestic appliance. This active noise cancellation apparatus has a pickup device (1, 20) to translate the noise into an electrical signal, a buffer amplifier (2, 22) to allow the distribution of those signals to a digital filter section (3) having a series of switched capacitor filters for analyzing and dividing the signal into separate harmonic signals, a dual analog delay line (4) for producing a phase shift in the signals, a summing amplifier (2,6) to recombine the signals into one signal, a power amplifier (5, 27) to drive an output loudspeaker (6, 31) which produces a phase shifted sound wave to cancel the noise generated by the ambient noise source.

21 Claims, 4 Drawing Sheets

ACTIVE NOISE CANCELLATION APPARATUS AND METHOD

CROSS-REFERENCE TO A RELATED APPLICATION

This application claims priority of Korean Patent Application No. 0208507, filed May 7, 1997.

BACKGROUND OF THE INVENTION

The present invention relates to an active noise control system, and particularly to a device for canceling periodic noises generated by electro-mechanical rotating mechanisms, such as washing machines, refrigerators, air conditioning systems and the like.

Most homes now have a variety of laborsaving and convenience devices, such as washing machines, spin-driers, refrigerators, air conditioning systems, swimming pool pumps and so forth. These devices ultimately depend on some type of electro-mechanical rotating device for functioning. Most of these devices are also in continuous use. A refrigerator for instance, runs continuously throughout the year, though the washing machine may only be used once or twice a week. During summertime, the drone of air conditioning compressors is a constant reminder of their existence. All of these devices have a common problem; they all make a lot of noise. Some noises have been shown to be detrimental to the health of some people. Low frequency noises in particular, cause headaches and in some cases will cause some form of nausea or upset stomach. Clearly, a device that can reduce the effects of these low frequency noises and vibrations will improve the general well being of the inhabitants of the home or workplace where these noises are present.

In addition to the above, one of the problems associated with any type of rotating machine such as those suggested above, is that the housings or enclosures surrounding these mechanisms are normally vented to allow free circulation of air for cooling purposes. These same vents that allow air to circulate also allow the noise to escape. Various degrees of passive noise reduction have been tried, with greater or lesser success, for many years. But adding soundproofing materials to a motor enclosure restricts cooling air flow. Therefore, a compromise has to be reached where the sound level is acceptable, and the cooling effect on the motor is reasonable for the duty cycle involved on the motor. Vibration-isolation motor mounts, and vibration absorbing foam goes some way toward correcting the noise pollution emitted by these mechanisms, but the plurality of ventilation openings cut in the enclosure of the machine negates the small effects each one provides. But the ventilation ports are not the only source of the noise. The enclosure of such equipment, especially a refrigerator or washing machine, acts as a sounding board for these low frequency noises, and even amplifies the noise by spreading out the sound source to a larger surface area.

There have been many attempts at reducing the noise output of machinery of all types for many years. Most of the methods tried have been passive approaches; e.g., sound absorbing foams, insulating blankets, baffles and so forth. The improvements in these acoustic insulators in recent years has been beneficial in a lot of cases but, more often than not, the higher frequencies are more readily absorbed by such measures, leaving lower frequencies relatively unchanged. This is partly due to the fact that the casing of the machine in question has some resonance at the lower frequencies, and tends to accentuate them, so they become more apparent.

With the advances in electronics in recent years, and with digital signal processing, in particular, several other inventors have shown various ways of creating an anti-noise signal, which, when applied in the right manner, can indeed reduce the sound level of the noise source. Most of these designs have been centered around the digital signal processing techniques so popular now.

The prior art includes numerous patents for noise reduction devices. For instance U.S. Pat. No. 4,953,217, issued to Twiney et al. on Aug. 28, 1990, teaches a noise reduction system for use in ear protection headsets. U.S. Pat. No. 5,125,241, issued to Nakanishi et al. on Jun. 30, 1992, describes a noise attenuation device for a refrigerator. U.S. Pat. No. 5,129,003, issued to Saruta on Jul. 7, 1992, teaches an active noise control apparatus for domestic appliances which generates a sound wave having an opposite phase and amplitude to the noise generated by the appliance. U.S. Pat. No. 5,140,640, issued to Graupe et al. on Aug. 18, 1992, teaches yet another noise cancellation system. U.S. Pat. No. 5,267,320, issued to Fukumizu on Nov. 30, 1993, teaches a noise control device in a movable system. U.S. Pat. No. 5,365,594, issued to Ross et al. on Nov. 15, 1994, teaches an active sound control device primarily for vibration control. U.S. Pat. No. 5,381,485, issued to Elliott on Jan. 10, 1995, describes another active sound control device. U.S. Pat. No. 5,485,523, issued to Tamamura et al. on Jan. 16, 1996, teaches a noise reduction device for use in an automobile. U.S. Pat. No. 5,488,667, issued to Tamamura et al. on Jan. 30, 1996, discloses another noise reduction system for use in a automotive vehicle. U.S. Pat. No. 5,491,747, issued to Bartlett et al. on Feb. 13, 1996, describes a noise reducing telephone handset using passive means to cancel the noise. U.S. Pat. No. 5,493,616, issued to Iidaka et al. on Feb. 20, 1996 describes another device for reducing the noise generated by an automotive vehicle. U.S. Pat. No. 5,499,301, issued to Sudo et al. on Mar. 12, 1996 describes an active noise cancellation apparatus for controlling noise generated by a compressor. U.S. Pat. No. 5,508,477, issued to Kato et al. on Apr. 16, 1996, covers an apparatus for reducing noise in an office utilizing a Helmholtz resonator. U.S. Pat. No. 5,539,831, issued to Harley on Jul. 23, 1996, describes an active noise control processor for use in a stethoscope. U.S. Pat. No. 5,546,467, issued to Denenberg on Aug. 13, 1996, teaches another noise attenuation device for use with domestic appliances. U.S. Pat. No. 5,559,893, issued to Krokstad et al. on Sep. 24, 1996, describes another noise reduction device which uses microphones and loud speakers. U.S. Pat. No. 5,581,619, issued to Shibata et al. on Dec. 3, 1996, discloses another noise reduction system for use within a vehicle. U.S. Pat. No. 5,600,729, issued to Darlington et al. on Feb. 4, 1997, discloses an active noise control system for use within an air cover. U.S. Pat. No. 5,602,927, issued to Tamamura et al. on Feb. 11, 1997, covers another noise reduction system for use within an automotive vehicle. Finally, U.S. Pat. No. 5,619,581, issued to Ferguson et al. on Apr. 8, 1997, describes another active noise and vibration control system which uses digital signal processors.

Unlike the above patented noise reduction/cancellation devices the present invention employs a simpler method of obtaining the same results, without the need to actually generate an anti-phase signal required for noise cancellation. The invention is manually adjustable so it can be used in a wide variety of noise frequency situations. Being adjustable, it can then be adjusted to give the most effective noise cancellation possible for the particular location and application. Furthermore, the device may be installed on new equipment prior to being sold, or may be bought and installed as a separate aftermarket add-on device for older equipment.

SUMMARY OF THE INVENTION

The primary object of the present invention is to provide domestic appliances and other equipment with a noise attenuating function wherein the audible noise generated by the electro-mechanical device driving the equipment is actively attenuated.

Another object of the present invention is to provide such a noise attenuating apparatus that is controllable by the user of the equipment, or by the agent installing the device.

An even further object of this invention is to provide such an apparatus which can be either installed in the electro-mechanical device when made or during use later.

The present invention accomplishes the above and other objects by providing an apparatus that cancels ambient noise by having an input sensor means, an input amplifier, means for analyzing and dividing the signal, means for introducing a half cycle phase delay, means for recombining the signals into one signal with an output amplifier for passing the signal to an output loudspeaker to effectively cancel the ambient noise. The sensor means picks up ambient noise and converts it into an electrical input signal containing amplitude and temporal information corresponding to the frequency wave of the ambient noise. The input signal is then fed through an input amplifier to a series of digital filters which divide the signal into a fundamental signal and a series of separate harmonic signals of different frequency ranges. Then each of the harmonic signals is fed through delay lines which introduce a half cycle phase delay to the signals. Then the signals are combined into an output signal which is then amplified and passed to a transducer to yield an output noise having a frequency wave which is shifted one half cycle from the frequency of the ambient noise such that the ambient noise is canceled. The means for introducing the phase delay may be adjustable by a potentiometer by which one can manually alter the phase shift before the input and output signal to achieve the ultimate sound reduction. The system also contains a feed back loop to prevent the apparatus from canceling out the output noise of the apparatus itself. The method of canceling noise by introducing a half cycle phase shift is also covered.

The above and other objects, features and advantages of the present invention should become even more readily apparent to those skilled in the art upon a reading of the following detailed description in conjunction with the drawings wherein there is shown and described illustrative embodiments of the invention.

DESCRIPTION OF THE PREFERRED EMBODIMENTS

Figure 1:
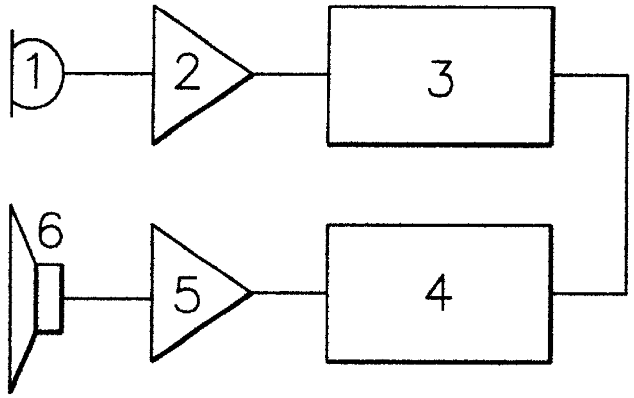
FIG. 1 is a generalized block schematic diagram of the noise cancellation system of the present invention.

Referring to the block diagram shown in FIG. 1, the system is illustrated simply as comprising several discrete parts that work together to produce the anti-phase signals required for the proper functioning of the invention. This drawing shows the noise pick-up transducer 1, the buffer amplifier 2, the digital filter 3, the delay line 4, the power amplifier 5, and the output transducer 6.

The offending noise is picked up by the noise pick-up sensor 1 and is converted into an electrical voltage signal containing amplitude and temporal information corresponding to the sound waves of the noise generated by the equipment. The noise signal is then transmitted through a shielded cable to the buffer amplifier 2 for distribution to the main circuit. This buffer amplifier 2 is necessary to prevent overloading the pick-up transducer 1 and provides gain to compensate for signal loss in the circuit.

The electrical signal passes from the buffer amplifier 2 to the digital filter section 3. Although for simplicity of explanation here only one digital filter 3 is shown, there are actually a number of these filters, each tuned to the harmonic of the fundamental frequency of the noise source. In this section, the signals are broken into fundamental, plus odd and even harmonics. The filters are clock driven switched-capacitor filters to control the fundamental frequency being selected, and its harmonics. Passing through the digital filter section 3 the signals then enter the delay lines 4, where they are subject to a delay determined by the fundamental frequency that is the object of elimination. This delay is also adjustable and directly changes the phase relationship between the noise and anti-noise signals for optimizing the performance of the apparatus in any ambient noise situation. The delay lines 4 are also clock driven.

After leaving the delay lines 4, the composite signals are recombined at the input to a power amplifier 5, where they are amplified before being passed on to the output transducer 6 to produce a noise which cancels the ambient noise.

Figure 2:
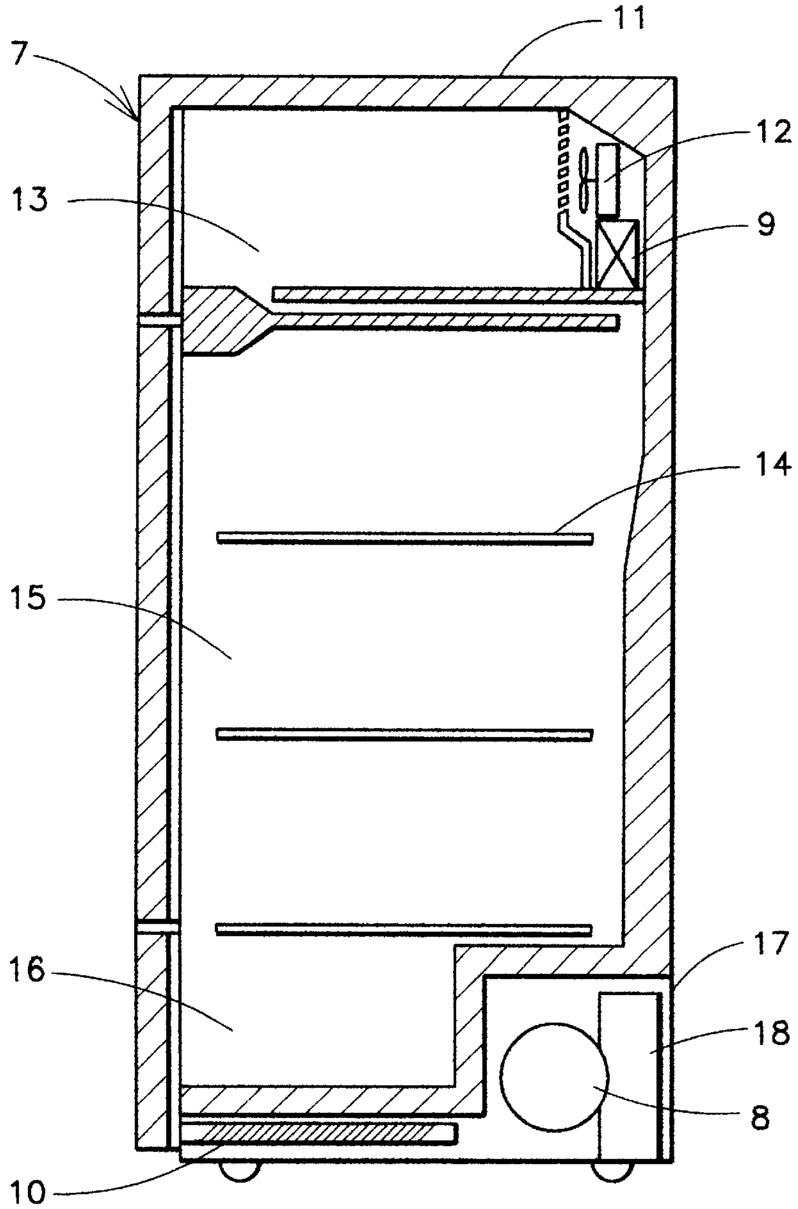
FIG. 2 is a typical installation of the noise cancellation apparatus in a refrigerator.

FIG. 2 shows a cutaway drawing of the inside of a refrigerator 7 as an instance. Here, noise and vibration generated by the running of the compressor 8 is conducted through coolant tubing to the evaporator coils 9, the condenser coils 10 and the supporting enclosure 11. Air circulation by the fan 12 filters down through the vents in the freezer compartment 13 to cool the remainder of the refrigerator. Loading the refrigerator with food items in the freezer compartment 13, the storage shelves 14 in the refrigerator compartment 15, and the vegetable drawer 16 reduces the apparent noise because of some damping of the mechanical vibrations in these compartments, due to the soft food items acting as cushions. However, the acoustic noise coming from the compressor compartment is not attenuated in any way, and the compartment cover 17 offers little, if any attenuation. The compartment cover 17 is usually made of some composite material or a steel panel, and contains vents for air circulation.

The noise canceling apparatus 18 of the present invention is preferably situated in close proximity to the compressor 8 in the compressor compartment. As already stated, this is preferable as it would introduce fewer errors and would therefore require less correction to achieve the overall effect. The position of the noise canceling device may vary according to the type of refrigerator, the manufacturer, the design and other factors.

Figure 3:
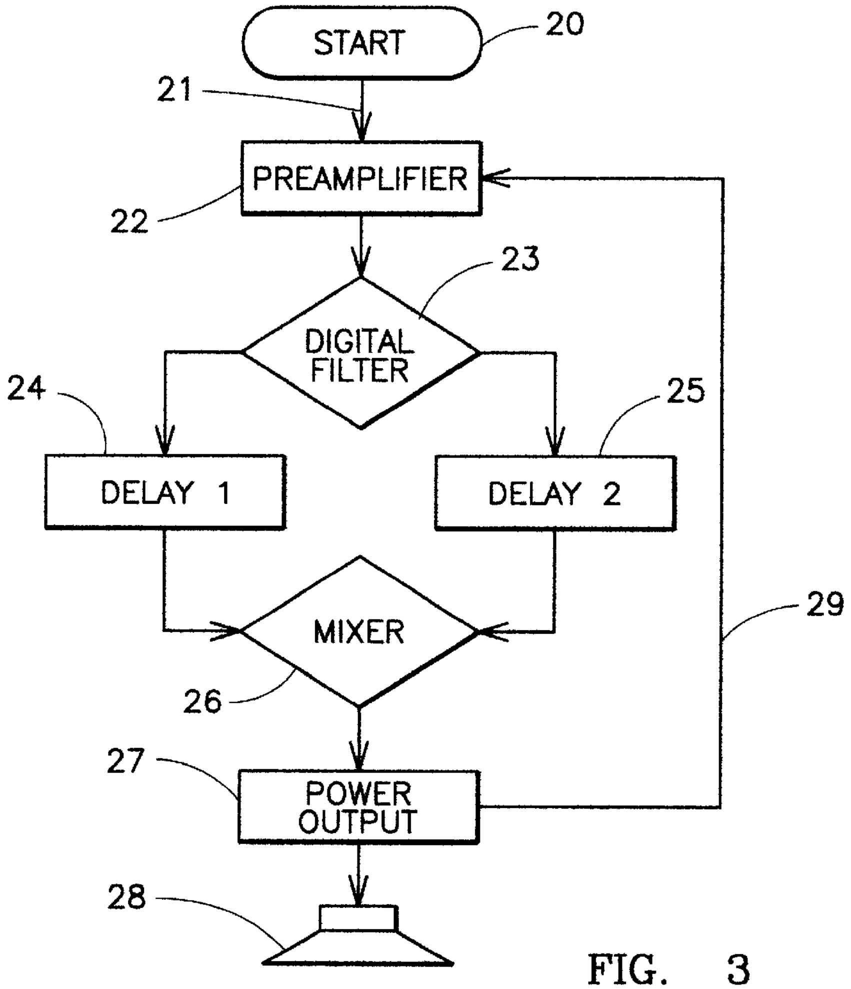
FIG. 3 is a flowchart for explaining the noise reduction operation.

FIG. 3 provides an overall flowchart for the noise canceling apparatus. At the start 20, sounds are picked up by an input transducer and fed through a shielded cable 21 to the input preamplifier 22. The input amplifier 22 prevents unwanted loading effects that may arise if the pickup is connected directly to the digital filter sections 23. The input preamplifier 22 also makes the circuit more stable and less prone to temperature effects. Furthermore, the input preamplifier 22 also allows a wide range of input transducer types to be used in conjunction with the noise canceling apparatus of the present invention. Each application may require a different type of input sensor for the best results, and the amplifier makes this very easy to change, without causing instability in the circuit.

From the output stage of the preamplifier 22 the noise signal passes to the digital filter section 23 where the noise signal is analyzed in the frequency domain. The digital filters 23 are clock driven, and an adjustable clock determines the frequency at which the filters reach cutoff. There are a number of filters in this section, each one tuned to the fundamental frequency, or a harmonic of the fundamental frequency in question. In order for the circuit to respond favorably with a wide frequency range, it is necessary for the harmonics to be separated this way. For a squarewave, the harmonic content can be determined by taking the sum of the fundamental frequency and all the harmonics or overtones. An analysis of a squarewave shows that it is made up of the fundamental frequency f plus an infinite series of odd harmonics in the series $f+\frac{1}{3}\sin\omega\tau\mathbf{3}+\frac{1}{5}\sin\omega\tau\mathbf{5}+1/n\sin\omega\tau n$. A similar analysis of a sawtooth wave will yield a similar pattern, but here the harmonics are more evenly distributed. A triangular wave will also show a mixture of harmonics, but will be more even than odd.

Complex periodic waveforms associated with noise have some attributes of all three of these waveforms, and can be broken down into the fundamental frequency and harmonics in the same way. The anti-noise device described herein contains a number of active filters that can be individually tuned to the fundamental frequency and any harmonic of a frequency that is a significant contributor to the noise. Theoretically, there is no limit to the number of filters and delay stages that may be added to the basic circuit described here. But practically, there has to be a limit, or at least a compromise perhaps between cost and effectiveness.

After leaving the digital filter section 23, the noise signal is broken down into the fundamental harmonic, plus even harmonics and odd harmonics. This breakdown is necessary to allow gain compensation for overcoming losses in the circuit. In the case of the periodic signals mentioned above, the higher frequency harmonics get smaller as the frequency increases. The amount of attenuation varies with the waveform, but is a known quantity. But in the case of the noise signals, the harmonic content will be largely unknown, and so some allowance must be provided for these signals, so that circuit losses can be compensated for.

The signals are then fed through an analog delay section, where a known time delay is introduced. The delay section includes several delays, such as delay 24 and delay 25 shown in FIG. 3. The number of delays depends on the complexity of the noise. The time delay is clock derived, and can be accurately controlled by means of a multi-turn potentiometer. This time delay causes the noise signal to be delayed for a known (adjustable) time period. Thus, for any periodic wave, the delay can be adjusted so that the phase delay between input and output signals can be controlled over several cycles of the waveform.

The signals are then passed on to the mixer circuit 26 that takes the individual signals and mixes them to become one signal before passing it to the power amplifier 27, where it is boosted to a level where it can drive the loudspeaker 28 which yields an output noise which is shifted one-half cycle to the input noise. The level of the output from the loudspeaker 28 is now adjusted to give the same acoustic level as the noise coming from the noise source to produce a nullity where the noise and anti-noise signal wavefronts meet. Feedback 29 from the power amplifier 27 to the preamplifier 22 prevents the device from trying to nullify its own output.

Figure 4:
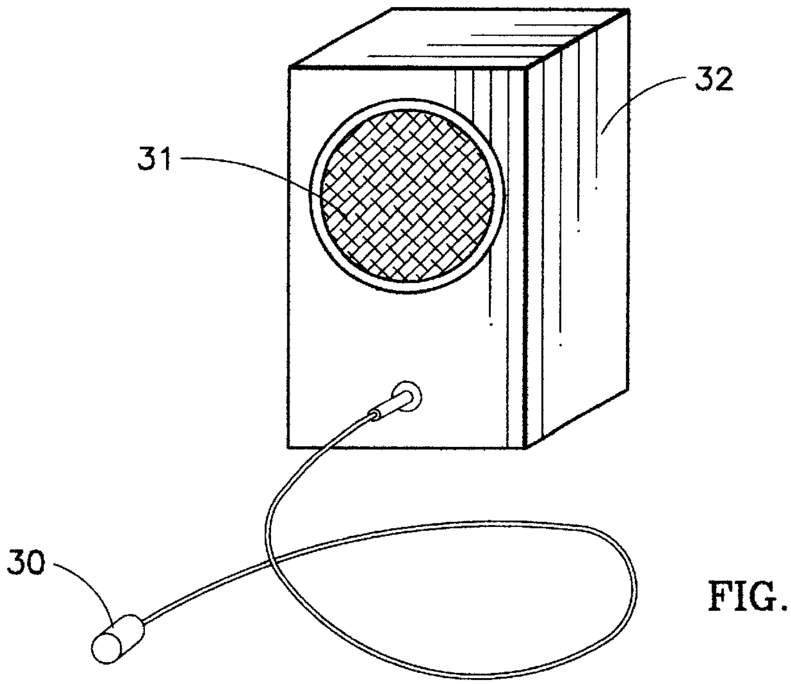
FIG. 4 is a perspective view of the sound reduction device in a typical enclosure.

FIG. 4 shows a typical appearance of the anti-noise device of the present invention. This illustrates only one form of the device, as the housing will depend on the environment in which the device will be used. Two essential parts of the device, the input transducer 30 and the loudspeaker 31, are shown, along with a typical enclosure 32 for the electronics.

Figure 5:
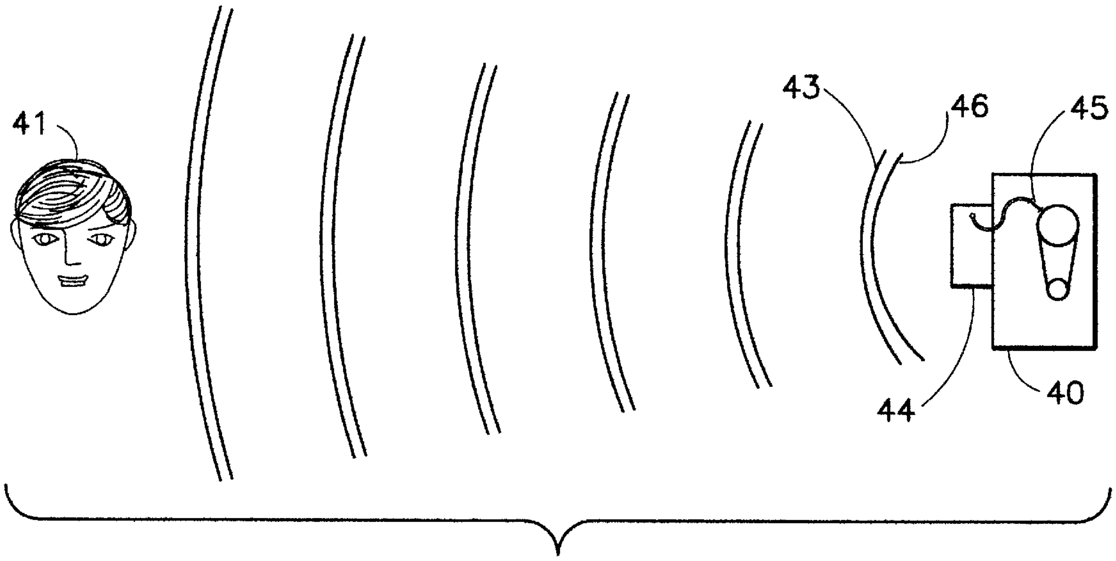
FIG. 5 is a drawing showing how the noise reduction sound waves interfere with the original noise signal to produce a cancellation effect.

FIG. 5 shows fundamentally how the present invention works. Noise 43 in the form of pressure wavefronts coming from a rotating electromechanical device 40, such as a washing machine, air conditioner or other device, reaches the ear of a listener 41 in a given time "T." The noise is also picked up through the transducer 45 of the electronic enclosure box 44 attached to the electromechanical device 40. The noise signal is delayed by a half cycle going through the anti-noise device electronics, and the resultant sound coming from the device are sound waves 46 of equal amplitude as the original signal, but delayed by time $\frac{1}{2}f$, wherein "f" is the frequency of the noise, such that the noise reaching the listeners ear after time "T" will be in opposition to that signal coming directly from the electromechanical device 40. Thus, the noise and anti-noise signals cancel each other out. In the drawing the leftmost lines of each wavefront pair, such as 43 in the first wave pair, represent the high pressure (compression) wavefronts coming from the electromechanical device, while the rightmost lines, such as 46 in the first wave pair, represent the low pressure (rarified) wavefronts being generated by the noise cancellation apparatus of this invention.

Figure 6:
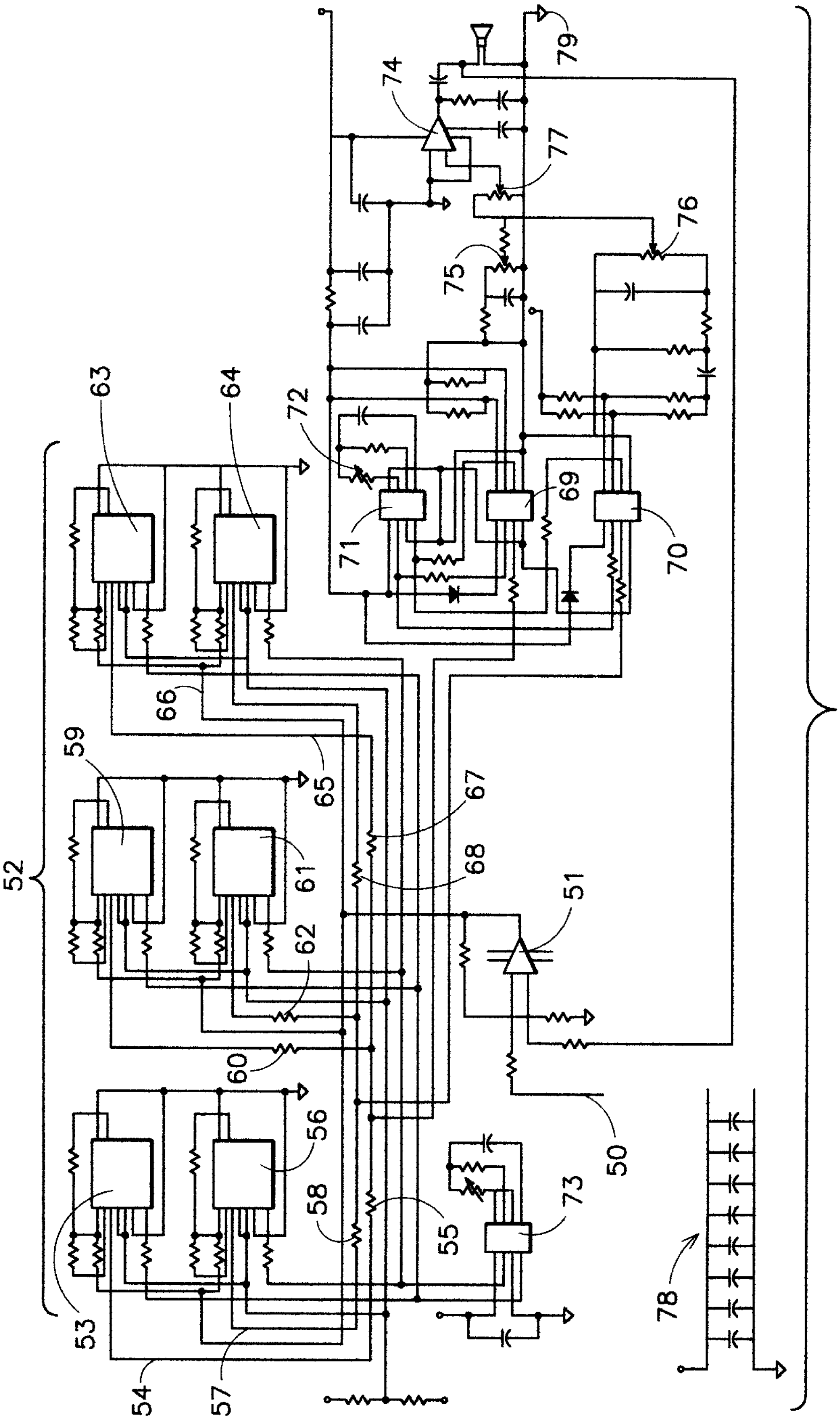
FIG. 6 is a circuit diagram of a prototype anti-noise device.

FIG. 6 shows a schematic diagram of a prototype system of the present invention. No component values are given in this presentation, since values depend on the individual application. However, the overall function of the schematic can be realized by anyone familiar with electronic circuits, and in particular, the components used in this invention. Starting at the input preamplifiers 51 the noise input signal 50 is boosted a little to overcome losses in the overall circuit, and to prevent overloading the input transducer 51. There is a phase inversion here caused by the phase inverting output of the amplifier 51. This is of no consequence here because the proper phase shifting is done in later stages. After leaving the amplifier 51, the signal goes into the digital filter section 52 where it is broken down into the fundamental signal plus a series of harmonics. A first digital filter 53 extracts the fundamental frequency (let's say 60 Hz) from the noise signal and passes it on to the first delay in line 54 via resistor 55. A second digital filter 56 extracts the second harmonic (120 Hz) from the noise signal, and passes it onto the second delay in line 57 via resistor. 58. A third digital filter 59 then extracts the third harmonic (180 Hz) from the noise signal and passes this on the first delay line 54 via resistor 60, along with the fundamental frequency. A forth digital filter 61 takes the fourth harmonic (240 Hz) and passes this through resistor 62 on the second delay line 57 along with the second harmonic. The same process occurs in the fifth and sixth digital filters 63 and 64 which send out the fifth and sixth harmonics, respectively, to delay lines 65 and 66 via resistors 67 and 68, respectively. The summary function of these six resistors thus consist of signal voltages proportional to six frequencies f1, f3, f5, and f2, f4 and f6 respectively. These broken down signal frequencies are then driven through first and second delays 69 and 70, where the phase delay is introduced. Although the delays are independent of each other, they are driven together by a common clock 71 set to run at the correct speed by a potentiometer 72. The potentiometer 72 controls the delay time of the signal passing through, and thus alters the phase shift between input and output of the noise signal, and is one of the user-adjustable controls incorporated for convenience during the installation.

The signals coming from the delay lines contain some clock noise, which is unavoidable. Therefore, a low-pass filter 73 is provided following the delay stages to filter out this clock noise. Clock noise has a very high frequency compared to the noise being modifying, so it is easily filtered out using passive component techniques. The signal presented to the output power amplifier 74 via volume controls resistors 75, 76 and the master control resistor 77, consists of the recombined delayed signals from delays 69 and 70.

The volume controls 75 and 76 are used to balance out the resulting signals from the delays 69 and 70. If these are not balanced correctly, then the effectiveness of the anti-noise device of the present invention is diminished. The volume controls 75 and 76 are not user accessible, but the master volume control 77 is user accessible as it is brought out to the front panel on the enclosure of the invention for adjustment during setup. Additional capacitors 78 may be added to the circuitry to prevent unwanted feedback through the power supply lines. Feedback loops 79 from the output stage to the input preamplifier 51 prevents the present invention from trying to cancel out its own sound input.

Figure 7:
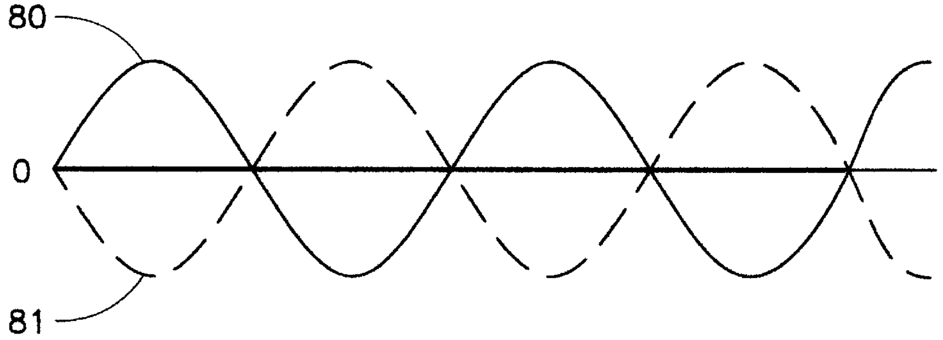
FIG. 7 (PRIOR ART)
FIG. 7 is a graphical diagram showing the technique of active noise reduction/cancellation devices employed by much of the prior art.

In summary, the concept involved in the operation of the present invention can be better understood by contrasting it to that employed by most active noise reduction/cancellation devices in the prior art. As illustrated in FIG. 7, such prior art devices generate another noise wave 81 which is "anti-phase" or in the opposite phase to the noise wave 80 of the electromechanical device. Although if working perfectly the net result of such a prior art device may be no noise, i.e., the "O" line in FIG. 7, such prior art devices are more complex and rarely reduce the noise to a nullity.

Figure 8:
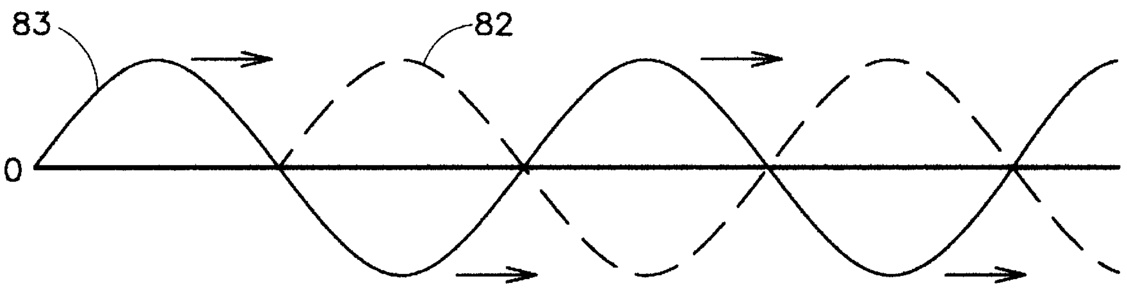
FIG. 8 is a graphical diagram showing the noise cancellation technique used in the present invention.

On the other hand, the present invention achieves better results without having to generate a separate noise. Rather the present invention uses the noise generated by the electromechanical device it intends to cancel and digitally filters it to extract various harmonics to yield a "shifted phase" wave 82 of the original noise wave 83 to cancel as shown in FIG. 8.

Thus, the present invention works to reduce the ambient audible noise by producing another noise, equal in amplitude but exactly shifted and opposite in phase relationship, to the offending noise. Thus, when the two noise signals reach the listener's ears at the same time, they effectively nullify each other.

To achieve the best above-described results, the positional and directional relationships of the noise source and the anti-noise source must be carefully selected. It is preferable that the anti-noise source be placed as close as possible to the originating noise source, as this will introduce the least amount of phase error between the two signals when the location of the listener changes with respect to the source of the noise.

Although only a few embodiments of the present invention have been described in detail hereinabove, all improvements and modifications to this invention within the scope or equivalents of the claims are covered by this invention.

Having thus described our invention, we claim:

1. An apparatus for canceling ambient noise, said apparatus comprising:

sensor means for picking up the ambient noise and converting it into an electrical input signal containing amplitude and temporal information corresponding to a frequency wave of ambient noise;

an input amplifier for providing gain in the electrical signal received from the sensor means;

means for analyzing and dividing the input signal into a fundamental signal and a series of separate harmonic signals;

means for introducing a half cycle phase delay in said fundamental signal and each of said series of separate harmonic signals;

means for recombining the separate harmonic signals into an output signal and providing said signal to an amplifier;

an output amplifier for amplifying the output signal for passing on to an output means; and an output means for converting the output signal to an output noise having a frequency wave which is shifted one half cycle from the frequency of the ambient noise such that the ambient noise is virtually canceled.

2. The apparatus of claim 1 wherein the sensor means comprises a transducer.

3. The apparatus of claim 1 wherein the means for analyzing and dividing the input signal comprises a series of switched capacitor filters, each of said series of filters designed to separate the input signal into a series of harmonic signals of different frequencies which make up the input signal promulgated by the ambient noise.

4. The apparatus of claim 2 wherein the means for analyzing and dividing the input signal comprises a series of switched capacitor filters, each of said series of filters designed to separate the input signal into a series of harmonic signals of different frequencies which make up the input signal promulgated by the ambient noise.

5. The apparatus of claim 1 wherein the means for introducing a half cycle phase time delay in each harmonic signal comprises an analog delay.

6. The apparatus of claim 2 wherein the means for introducing a half cycle phase time delay in each harmonic signal comprises an analog delay.

7. The apparatus of claim 3 wherein the means for introducing a half cycle phase time delay in each harmonic signal comprises an analog delay.

8. The apparatus of claim 4 wherein the means for introducing a half cycle phase time delay in each harmonic signal comprises an analog delay.

9. The apparatus of claim 1 wherein the means for recombining separate harmonic signals into an output signal comprises a summing amplifier.

10. The apparatus of claim 2 wherein the means for recombining separate harmonic signals into an output signal comprises a summing amplifier.

11. The apparatus of claim 3 wherein the means for recombining separate harmonic signals into an output signal comprises a summing amplifier.

12. The apparatus of claim 4 wherein the means for recombining separate harmonic signals into an output signal comprises a summing amplifier.

13. The apparatus of claim 5 wherein the means for recombining separate harmonic signals into an output signal comprises a summing amplifier.

14. The apparatus of claim 6 wherein the means for recombining separate harmonic signals into an output signal comprises a summing amplifier.

15. The apparatus of claim 7 wherein the means for recombining separate harmonic signals into an output signal comprises a summing amplifier.

16. The apparatus of claim 8 wherein the means for recombining separate harmonic signals into an output signal comprises a summing amplifier.

17. The apparatus of claim 1 wherein the means for introducing the phase delay is adjustable.

18. The apparatus of claim 17 wherein the means for introducing a phase delay is adjustable by a potentiometer which can further alter phase shift between input signal and output signal.

19. The apparatus of claim 1 wherein the output amplifier is connected to the input amplifier by a feedback loop so that the output signal is fed back to the input amplifier to prevent the apparatus from trying to cancel the output noise of the apparatus.

20. A method for canceling ambient noise, said method comprising the steps of:

a. picking up ambient noise and converting it into an electrical input signal containing amplitude and temporal information corresponding to a frequency wave of the ambient noise;

b. amplifying said input signal;

c. analyzing and dividing the input signal into a fundamental signal and a series of separate harmonic signals;

d. introducing a one half cycle phase delay in each of said series of separate harmonic signals;

e. recombining the separate harmonic signals into an output signal and providing said output signal to an amplifier;

f. amplifying the output signal for passing on to an output means; and converting the output signal to an output noise having a frequency wave which is shifted one half cycle from the frequency of the ambient noise such that the ambient noise is canceled.

21. The method of claim 20 wherein step d further comprises the step of:

adjusting the delay to alter the phase shift between the input signal and the harmonic signal.

* * * * *